United States Patent [19]

Stradley et al.

[11] Patent Number: 4,975,762
[45] Date of Patent: Dec. 4, 1990

[54] ALPHA-PARTICLE-EMITTING CERAMIC COMPOSITE COVER

[75] Inventors: Norman H. Stradley, Stillwater; James A. Woolley, Coon Rapids, both of Minn.

[73] Assignee: General Electric Ceramics, Inc., Chattanooga, Tenn.

[21] Appl. No.: 272,732

[22] Filed: Jun. 11, 1981

[51] Int. Cl.$^5$ ............................................. H01L 23/08
[52] U.S. Cl. ......................................... 357/74; 357/29
[58] Field of Search ........................ 357/29, 84, 74, 72

[56] References Cited

U.S. PATENT DOCUMENTS

| | | | |
|---|---|---|---|
| 2,966,719 | 1/1961 | Park, Jr. | 25/156 |
| 3,549,784 | 12/1970 | Hargis | 174/68.5 |
| 3,864,810 | 2/1975 | Hargis | 29/423 |
| 3,926,746 | 12/1975 | Hargis | 204/15 |
| 4,017,886 | 4/1977 | Tomono et al. | 357/72 |
| 4,040,083 | 8/1977 | Saiki et al. | 357/72 |
| 4,224,637 | 9/1980 | Hargis | 357/74 |
| 4,323,405 | 4/1982 | Uno et al. | 357/84 |

FOREIGN PATENT DOCUMENTS

| | | |
|---|---|---|
| 55-52245 | 4/1980 | Japan. |
| 55-93239 | 7/1980 | Japan. |
| 2036428 | 6/1980 | United Kingdom. |
| 2039145 | 7/1980 | United Kingdom. |

OTHER PUBLICATIONS

Anolick, IBM Tech. Disclosure Bulletin, vol. 22, No. 2, Jul. 1979, p. 678.
Ward, IBM Tech. Disclosure Bulletin, vol. 22, No. 4, Sep. 1979, p. 1398.
Brody et al., IBM Tech. Discl. Bulletin, vol. 22, No. 4, Sep. 1979, pp. 1460-1461.
Dougherty et al., IBM Tech. Discl. Bulletin, vol. 22, No. 4, Dec. 1979, p. 2748.
Fogiel, Modern Microelectronics, (Research & Education Assn, N.Y., 1972) pp. 114-116, 139.
Mukai et al., IEEE J. of Solid State Circuits, vol. SC 13, No. 4, Aug. 1978, pp. 462-467.
"Soft Errors in VLSI—Present and Future", by Timothy C. May presented at the 29th Electronic Components Conference, May 14-16, 1979, Cherry Hill, N.J.
"Overcoats Protect RAMs from Alphas", *Electronics*, pp. 41-42 (Sep. 11, 1980).
"Polyimide Film—Not Liquid—Shields RAMs from Alpha Particles", *Electronic Design*, p. 36 (Nov. 22, 1980).
"Alpha Particles May be Cause of Soft Errors in Memory", *Electronic Design* 11, p. 37 (May 24, 1978).
"A New Physical Mechanism for Soft Errors in Dynamic Memories", by Timothy C. May and Murray H. Woods, IEEE Reliability Physics Symp., San Diego, Calif., (Apr. 1978).
"Can Proper Packaging Prevent Soft Errors in NMOS Memories?", *Microelectronic Manufacturing and Testing*, pp. 18-19 (Sep. 1979).
"Low Alpha-Particle-Emitting Ceramics: What's the Low Limit?", by James A. Woolley, Lawrence E. Lamar, Norman H. Stradley, and D. Max Harshbarger; IEEE Transactions on Components, Hybrids, and Manufacturing Technology; vol. CHMT-2; No. 2, (Dec. 1979).

*Primary Examiner*—William D. Larkins
*Attorney, Agent, or Firm*—Ernest F. Chapman

[57] ABSTRACT

A low alpha-particle-emitting ceramic composite cover which when used in a ceramic integrated circuit package to encapsulate an integrated circuit device, reduces soft errors caused by alpha-particles emitted from the ceramic material. An alpha-particle-absorbing barrier layer is attached to the major portion of the interior surface of the ceramic cover to absorb alpha-particles emitted by the ceramic material. The barrier layer may be an organic polymeric material or an inorganic high purity material. Preferably the barrier layer is a polyimide film which is attached to the ceramic cover by a glass sealant material. Various constructions of the composite cover and ceramic integrated circuit packages utilizing the composite cover are disclosed.

2 Claims, 1 Drawing Sheet

ALPHA-PARTICLE-EMITTING CERAMIC COMPOSITE COVER

FIELD OF THE INVENTION

This invention relates to a low cost, low alpha-particle-emitting ceramic composite cover which can be sealed to a ceramic integrated circuit base to provide a package for high density circuits with reduced potential for soft errors. The invention further relates to integrated circuit packages utilizing such low alpha-particle-emitting composite covers.

BACKGROUND OF THE INVENTION

In general, integrated circuit devices are usually sealed in a ceramic package (including a method known as cerdip, in which the ceramic package is sealed with glass), a plastic package, or a similar type of package. The package normally comprises a base carrying an integrated circuit device and a cover. Particularly when a ceramic package is used, the material of the package contains naturally occuring trace amounts of uranium and thorium in concentrations of the order of several ppm, as reported by T. C. May and M. J. Woods in "A New Physical Mechanism for Soft Errors in Dynamic Memories", IEEE Reliability Physics Symp., San Diego, Calif., April 1978. It is known that these impurities emit alpha-particles and, when present in the cover, are a major cause of soft errors in dynamic RAM (Random Access Memory) and CCD (Charged Coupled Device) memories. The problems caused by alpha-particle-emission are due to the materials lying above the active region of the integrated circuit device, in the cover. The alpha-particles generated by the ceramic material below the integrated circuit device must pass completely through the interior of the integrated circuit device in order to get to the active region and, therefore, are not troublesome since the excursion range of alpha-particles in the device is usually less than the thickness of the device.

Powders such as silica are used as fillers in plastic packaging materials with the same impurities being present. In these plastic packages the level of impurities in the filler is such that the alpha-particles emitted from the plastic packaging material above the encapsulated integrated circuit device, is still unacceptably high in spite of the fact that some of the alpha-particles emitted from the filler material are absorbed by the plastic. In addition, such plastic materials have the disadvantages of comparatively low moisture and heat resistance. It is therefore difficult to employ plastic encapsulated integrated circuit devices in high reliability systems. Hence, high reliability systems utilize ceramic packaging.

The prior art has attempted to reduce soft errors in ceramic packaging by purifying the packaging material to a high degree so that it does not contain either uranium or thorium (*IEEE Transactions on Components, Hybrids, and Manufacturing Technology*, Vol. CHMT-2, No. 4, December 1979). Usually, however, the packaging material is made of a composite material consisting of several raw materials and may contain impurities introduced in the various manufacturing steps. Thus, it has been extremely difficult to fabricate a package which does not contain uranium or thorium impurities.

Alternatively, a variety of curable liquid coatings including silicones, epoxies and organic polyimide have been applied directly to the integrated circuit devices to protect them from alpha-particle-generated soft errors (UK Patent Application No. 2,036,428). This approach presents several problems. Differing thermal expansion coefficients of the coating and the integrated circuit device can result in the coating pulling away from the integrated circuit device during the curing process or later in the field. Additionally, the differing thermal expansion coefficients may result in the bonding wires coming loose during curing or later use. Other concerns include the potential for contamination or corrosion of the integrated circuit device and difficulty in achieving a uniform coating thickness.

Machine-cut polyimide films have been used to cover the integrated circuit device by adhering the film to the device with an adhesive (*Electronics*, Sept. 11, 1980, p. 41). These films can be reproducibly made to the required thickness and since they are form-fitted can avoid the problems encountered with liquid application techniques in which the coating material covers the bonding area on the integrated circuit device. However, potential problems such as misalignment and adhesion breakdown in the field make this technique less than ideal.

SUMMARY OF THE INVENTION

The present invention relates to a low alpha-particle-emitting ceramic composite cover comprising a ceramic cover coated on the major portion of its interior surface with an alpha-particle-absorbing barrier layer. The invention also relates to a ceramic integrated circuit package comprising a ceramic base carrying the integrated circuit device, and the low alpha-particle-emitting composite cover described above. The package is assembled so that the barrier layer is substantially parallel to and spaced apart from the active region of the integrated circuit device.

According to a preferred embodiment of the present invention, the alpha-particle-absorbing barrier layer is a polymeric film which is attached to the interior surface of the ceramic cover by a glass sealant material. The glass sealant allows the composite cover to be sealed to a ceramic substrate at temperatures up to about 450° C. without breakdown in adhesion between the glass sealant and the barrier layer even though the glass sealant has a thermal expansion coefficient about three times lower than the barrier layer.

This invention eliminates the disadvantages inherent in the devices of the prior art. The present invention provides a ceramic composite cover for a ceramic integrated circuit package which, when used to encapsulate an integrated circuit device, reduces soft errors due to alpha-particles emitted by the ceramic packaging material of the cover.

In the present invention the barrier layer on the ceramic cover shields the integrated circuit device from alpha-particles emitted by the cover. Thus, the problems associated with protective layers applied directly to the integrated circuit device, as taught by the prior art, i.e., misalignment, chip contamination and wire bond fatigue, are effectively avoided.

DETAILED DESCRIPTION OF THE INVENTION

In the following Figures (FIGS. 1-3) some parts are shown enlarged for clarity.

Figure 1:
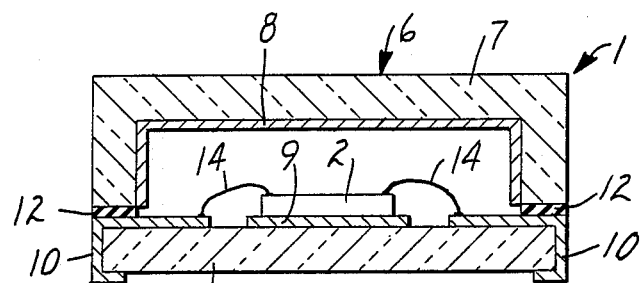
FIG. 1 is a cross-sectional view through a metallization trace of a single layer metallized cofired ceramic integrated circuit package having a recessed composite cover.

FIG. 1 shows an integrated circuit package in which an integrated circuit device 2 is encapsulated in a ceramic package 1 comprising a ceramic base 4 made according to the teachings of U.S. Pat. No. 3,926,746, incorporated herein by reference, and a low alpha-particle-emitting ceramic composite cover 6. The integrated circuit device 2 includes at least one active region which is liable to be affected by the absorption of alpha-particles. The ceramic material of cover 6 usually contains aluminum oxide as the principal constituent although any suitable ceramic material hitherto employed may be used. The preferred ceramic material is a high purity aluminum oxide which contains at least 85 percent by weight alumina. Among the preferred ceramic materials are those which contain 94% by weight alumina, commercially available as AlSiMag ® 620 and AlSiMag ® 777 black opaque alumina from 3M, and a material containing 96% by weight alumina, commercially available as AlSiMag ® 614 white alumina, also from 3M. Other ceramic materials such as beryllium oxide may be used. Beryllium oxide is not preferred, however, due to its expense and its toxicity.

The composite cover 6 comprises a ceramic cover 7 manufactured by dry-pressing ceramic powder and sintering to a unified state by techniques well known in the art (J. T. Jones and M. F. Berard, "Ceramics, Industrial Processing and Testing", the Iowa State University Press, Ames, Iowa, 1972), coated on its interior surface with an alpha-particle-absorbing barrier layer 8. The barrier layer 8 absorbs alpha-particles which are emitted by naturally occurring radioactive impurities contained in the ceramic cover 7 and reduces the potential for soft errors in the integrated circuit device 2. Suitable materials for layer 8 include organic polymeric materials, such as polyesters, polyethylolefins, polysulfones, polystyrenes, polyimides, acrylics, epoxies, polyamides, silicones and the like; and inorganic high purity materials. Preferred barrier layers contain such negligible amounts of uranium and thorium that the alpha-particles generated by such layers is less than about 100 $\alpha/cm^2/1000$ hrs. Particularly preferred barrier layers generate less than about 70 $\alpha cm^2/1000$ hrs and are made of materials such as polyimide, and aluminum oxide containing at least about 99 percent by weight alumina. Other useful inorganic layer materials include high purity alkaline earth oxides, high purity silicon dioxide, high purity phosphosilicate glass, high purity silicon nitride, high purity silicon carbide, and the like. Since the sealing of the ceramic package is normally performed at high temperatures, around 450° C., the barrier layer 8 should be sufficiently heat resistant to endure such temperatures.

The barrier layer 8 is required to be sufficiently thick to prevent alpha-particles generated from the ceramic cover 7 from penetrating through it. The required thickness of the barrier layer 8 is dependent upon the mass per unit area of the material comprising the layer. Preferably the thickness of the barrier layer 8 is about 25 to 130 microns, and more preferably the thickness is about 50 to 75 microns.

Among the preferred barrier layers are a 50 micron thick layer of polyimide film, commercially available as Kapton ® brand polyimide film from E. I. du Pont de Nemours Co., and a 50 micron thick layer of fine particle size (less than 0.5 micron), high purity (about 99.9 percent by weight) alumina.

The remaining components of the integrated circuit package illustrated in FIG. 1 are well known in the art. For example, metallization pad 9 to which integrated circuit device 2 is attached and metallization traces 10 which run from the interior to the exterior of the assembled package 1 are screen printed and sintered to base 4. Conventionally, metallization pad 9 and metallization traces 10 are made of materials such as tungsten, molybdenum-manganese, palladium, platinum, etc. The exposed surfaces of metallization traces 10 are metal plated, preferably with nickel and gold. Wires 14, preferably made of gold or aluminum, are bonded between the inner tips of metallization traces 10 and the integrated circuit device 2. The sealant material 12 between the composite cover 6 and the ceramic base 4 is preferably a low temperature, low alpha-particle-emitting, vitreous sealing glass, such as 3M Brand "SG-62" vitreous sealing glass, which melts to a sufficient degree to affect the seal at temperatures between about 400 and 420° C. Alternatively, where it is desired to seal the ceramic package at lower temperatures, an organic epoxy sealant such as 3M Brand "CPS-849" organic epoxy sealant may be utilized. "CPS-849" melts to a sufficient degree to affect the seal at temperatures between about 150 and 160° C.

Figure 2:
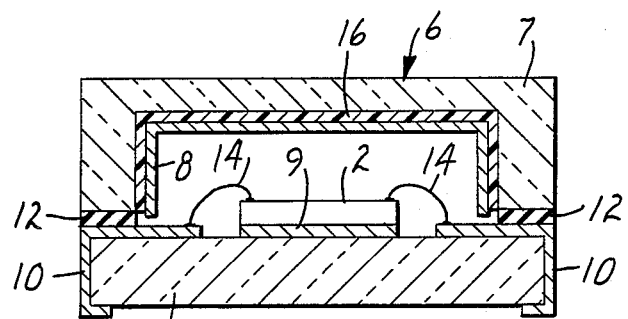
FIG. 2 is a cross-sectional view similar to FIG. 1 showing a modified composite cover construction.

In FIG. 2, an adhesive layer 16 is coated on the interior surface of ceramic cover 7. This adhesive layer 16 is utilized for attaching the barrier layer 8 to the ceramic cover 7, when the barrier layer is a polymeric film, such as a polyimide film. Adhesive layer 16 can be a glass sealant material or a pressure sensitive epoxy or silicone adhesive, or the like. Preferably the polymeric film is bonded to the ceramic cover 7 by coating a layer of glass sealant onto the interior surface of the cover, applying the polymeric film over the glass and sealing the composite at a temperature of about 420° C. for 5 minutes in an atmosphere of nitrogen or an inert gas. Alternatively, the glass sealant material may be first glazed at a temperature of about 395° C. for 5 minutes, after which the polymeric film is applied and the composite heated to a temperature of about 420° C. for 5 minutes.

Glass is preferred as the adhesive for the polymeric film because it is resistant to the high temperatures, i.e., around 450° C., at which ceramic packages are normally sealed. Particularly preferred glass sealant materials include the low temperature, low α-emitting glass sealants commercially available as "LS-0803" and "LS-0803" glass sealants from Nippon Electric Glass Co., Ltd., Osaka, Japan, and 3M Brand "SG-62".

It is surprising that glass sealant material is useful since the thermal expansion coefficient of glass is about $7 \times 10^{-6}$/°C., while the thermal expansion coefficient of, for example, polyimide film is about $20 \times 10^{-6}$/°C. One would expect that materials with such differing thermal expansion coefficients, would not withstand heating to temperatures up to 450° C. without a breakdown in their adhesion to each other and the resultant delamination of the barrier layer from the ceramic cover. Such, however, is not the case. A composite of a ceramic cover, a glass sealant and polyimide film can be heated in an inert atmosphere to temperatures up to 450° C. for up to 5 minutes without breakdown in adhesion between the glass sealant and the polyimide film.

In another embodiment of the package illustrated in FIG. 2, the adhesive layer 16 can be provided on the backside of the polymeric film comprising the barrier layer 8. For example, a pressure sensitive epoxy adhesive can be applied to one surface of a polyimide film. Alternatively a polyimide film with a silicone adhesive, commercially available as "Scotch ® Brand "Kapton" Film Tape Silicone Adhesive" from 3M, can be utilized. When these adhesives are utilized, the composite cover cannot withstand temperatures much above about 300° C. without degradation of the adhesive layer and delamination of the polyimide film.

Figure 3:
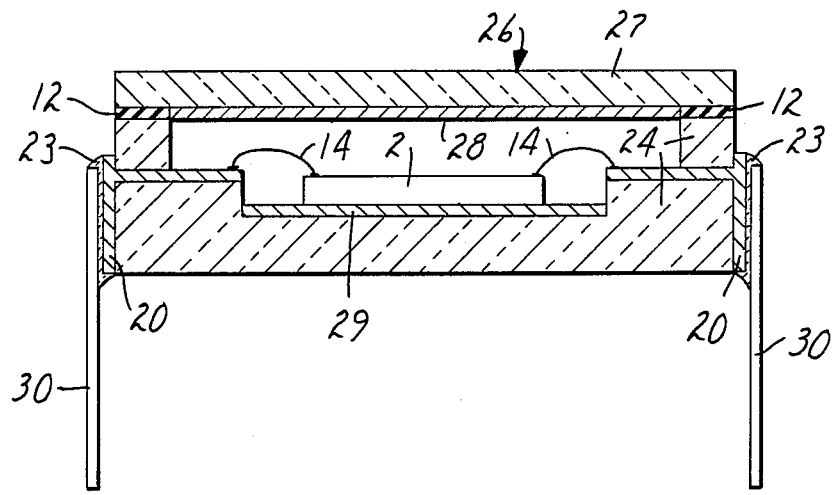
FIG. 3 is a cross-sectional view through the metallization traces of a multilayer cofired ceramic integrated circuit package having a flat composite cover.

FIG. 3 illustrates a multilayer cofired ceramic integrated circuit package utilizing a low alpha-particle-emitting ceramic composite cover. Composite cover 26 has a flat construction and comprises a flat ceramic cover 27 coated on its interior surface with an alpha-particle-absorbing barrier layer 28. Additional conventional features of the integrated circuit package illustrated in FIG. 3 are as follows: Multilayer cofired ceramic base 24 is manufactured according to the teachings of U.S. Pat. No. 4,224,637, incorporated herein by reference. Base 24 has a recess in its center and integrated circuit device 2 is located in this recess and attached to metallization pad 29. Base 24 is also metallized with metallization traces 20. Wires 14 are bonded between the integrated circuit device 2 and the inner tips of metallization traces 20. Leads 30 are attached to the metallization traces 20 by braze 23. Braze 23 is made from a composition of about 28% by weight copper and about 72% by weight silver. Preferably leads 30 are made of a nickel/cobalt/iron alloy commercially available as "Kovar ®" brand metal alloy from Westinghouse Co., or the nickel/iron alloy ASTM No. F 30-alloy 42. The periphery of composite cover 26 is sealed to ceramic base 24 by sealant 12 to completely seal the integrated circuit device 2.

The following examples describe specific illustrative embodiments of the present invention.

EXAMPLE 1

The number of alpha-particles generated (the alpha-flux) by a 10.16 cm diameter by 0.06 cm thick piece of AlSiMag ® 620 black opaque ceramic material containing about 94% by weight alumina, was measured by a Model RD-14 crystal scintillation radiation counter manufactured by Eberline Instrument Corp., Santa Fe, N. Mex. This instrument has a detection efficiency of 83% of alphaparticles emitted from a flat surface in an upward direction. The alpha-flux of one of the flat major surfaces of the AlSiMag ® 620 alumina ceramic material was found to be $139 + 3\alpha/cm^2/1,000$ hrs.

One major surface of the piece of ceramic material was then covered with a 10.16 cm diameter by 50.8 micron thick piece of Kapton ® brand polyimide film type 200H according to the following procedure. A printing paste was prepared by mixing 100 parts by weight of "LS-0803" glass sealant powder and 10 parts by weight of a vehicle containing 20% by weight acrylic resin dissolved in terpineol. This glass sealant-vehicle paste mixture was screen printed on the major surface of the ceramic. The sealant paste was dried at about 120° C. for 10 minutes in a laboratory oven. The polyimide film was then applied over the sealant and secured by applying a pressure of 4 psi. The composite was sealed in a belt furnace at 420° C. for 5 min. in a nitrogen atmosphere.

The adhesion of the polyimide film to the ceramic material was found to be exceptional, demonstrating that glass is an excellent adhesive for bonding polyimide film to ceramic material. Adhesion was determined visually and by pulling on the film. Additionally, the sealing process did not degrade the polyimide film, i.e., the film did not appear charred and was not cracked.

The alpha-flux of the polyimide coated ceramic surface was measured and found to be $39 + 3\alpha/cm^2/1,000$ hours.

EXAMPLE 2

Referring to FIG. 2, ten white alumina ceramic covers measuring 1.27 cm by 1.27 cm, having a height of 0.29 cm, and a wall thickness of 0.10 cm, commercially available as AlSiMag ® 614 white alumina covers (96% by weight alumina) from 3M Co., were lined on their interior surfaces with a barrier coating 8 of 50.8 micron thick polyimide film tape, commercially available as "Scotch ® Brand 'Kapton' Film Tape Silicone Adhesive" from 3M Co., to form composite covers 6. The composite covers 6 were then coated on their peripheries with an organic epoxy sealant 12 commercially available as "CPS-849" organic sealant from 3M. The composite covers 6 were then sealed to AlSiMag ® 614 ceramic bases 4 at a temperature between about 150 and 160° C. The resultant ceramic packages when subjected to the MIL STD-883-B Hermeticity Test Method 1014.2, Condition A-2, incorporated herein by reference, had no failures.

When the composite covers 6 were separated from the ceramic bases 4 by the procedure described in MIL-STD-883B, Method 2024 (incorporated herein by reference), no charring, discoloration or delamination of the polyimide film tape barrier layer 8 from ceramic cover 7 was observed.

The alpha-flux of the polyimide film tape coated ceramic composite covers 6 was measured by a model RD-14 crystal scintillation radiation counter and no alpha-flux was detected.

EXAMPLE 3

Again referring to FIG. 2, ten AlSiMag ® 614 white alumina ceramic covers of the size used in Example 2 containing 96% y weight alumina, were coated on their peripheries with a low temperature, low alpha-particle-emitting vitreous sealing glass 12, commercially available as "SG-62" sealing glass from 3M, and were coated on their inside surfaces with another low temperature, low alpha-particle-emitting sealing glass 16, commercially available as "LS-080" glass sealant from Nippon Electric Glass Co. The covers were then glazed in a belt furnace at about 395° C. for about 5 min., in a nitrogen atmosphere. Barrier layers 8 of 50.8 micron thick pieces of Kapton ® brand polyimide film type 200H, were cut to fit the interior of the ceramic covers. The polyimide films were pressed into the interior cavities of the covers by the use of a plate of AlSiMag ® 614 ceramic material which had been made to fit the cavity. The plate and polyimide film were held in the ceramic cover by a spring clip assembly and the composite was placed on a heater block at a temperature of about 450° C. for about 30 seconds. The composite was cooled to room temperature at a rate of about 70° C./minute, after which the clip and ceramic plate were removed. Adhesion of the polyimide film 8 to the interior of the ceramic covers 7 was visually observed and determined to be good. The usefulness of glass as a means for securing polyimide film to ceramic covers is surprising since glass has a thermal expansion coefficient of about $7 \times 10^{-6}$/°C. while the thermal expansion coefficient of the polyimide film is about $20 \times 10^{-6}$/°C.

The alpha-flux of the polyimide film surface of ceramic composite covers 6 was measured by a model RD-14 crystal scintillation radiation counter and found to be less than about 40 $\alpha/cm^2/1,000$ hours.

EXAMPLE 4

An alpha-particle-absorbing barrier layer comprising high purity aluminum oxide (99.99 percent by weight alumina), commercially available as "RC-HP-DBM" from Reynolds Metals Company, was applied to green ceramic sheets comprising about 95% by weight alumina, 3% by weight talc (e.g., magnesium silicate) and 2% by weight clay (e.g., hydrated aluminum silicate), according to the following procedure. The "RC-HP-DBM" aluminum oxide powder was prepared into a screening paste by mixing 100 parts by weight of the aluminum oxide powder and 10 parts by weight of a vehicle that contained 10 wt.% of acrylic resin dissolved in terpineol. This screening paste was applied, via screen printing technique, on the surface of 4 pieces, each 7.6 cm $\times$ 7.6 cm $\times$ 0.08 cm thick, of the ceramic green sheets described above. These composite sheets were dried at 120° C. for 5 minutes. The dried thickness of the coating was 152 microns. The composites e fired at a temperature of 1650° C. for 2 hours in air atmosphere. The fired thickness of the coating was 118 microns. The alpha-flux of the coated surface was measured by a Model RD-14 crystal scintillation radiation counter and found to be $76 + 3.8$ $\alpha/cm^2/1000$ hours. The alpha-flux of the uncoated surface was measured and found to be $168 + 4.4$ $\alpha/cm^2/1000$ hours.

EXAMPLE 5

Referring to FIG. 3, low alpha-particle-emitting ceramic composite covers 26 were prepared according to the following procedure.

Fine particle size (less than 0.5 micron), high purity aluminum oxide (99.9% by weight alumina), commercially available as alpha alumina grade A-6 alumina powder from Ugine Kuhlmann-France, was made into a slip and coated on a polyester film to a wet thickness of 127 microns according to the process described in U.S. Pat. No. 2,966,719, incorporated herein by reference to form an alpha-particle-absorbing barrier layer on the polyester film. The coated film was then dried, and a 94% by weight aluminum oxide ceramic material, prepared per the teachings of U.S. Pat. No. 2,966,719, was cast on top of the barrier layer to a thickness of 762 microns. After drying, the polyester film was peeled off, to yield a flat sheet of ceramic material having a high purity aluminum oxide barrier layer.

After application of the barrier layer, break lines for subsequent separation were laser scribed or razor-cut into the green sheet prior to firing. The scribed material was then fired at a temperature of 1650° C. for 2 hours in an air atmosphere to densify the aluminum oxide material. "SG-62" sealing glass 12 was applied along and on either side of the break lines, and around the periphery of the sheet. The sheet was then converted into individual composite covers 26 by mechanically separating along the break lines and integrated circuit packages such as those illustrated in FIG. 3 were assembled.

The alpha-flux of the barrier coated surface of the composite cover 26 was measured by a Model RD-14 crystal scintillation radiation counter and found to be less than about 80 $\alpha/cm^2/1,000$ hours.

What is claimed is:

1. A low alpha-particle-emitting composite cover for use in a ceramic integrated circuit package to shield an integrated circuit device from alpha-particles, comprising a ceramic cover coated on the major portion of its interior surface with an alpha-particle-absorbing layer comprising a polyimide organic polymer film adhesively bonded to said ceramic cover said composite cover also comprising a glass sealant adhesive layer between said ceramic cover and said organic polymer film.

2. A low alpha-particle-emitting ceramic composite cover for use in ceramic integrated circuit packages to shield said integrated circuit device from alpha particles, comprising a ceramic cover, an alpha-absorbing layer barrier layer coated on the major portion of the interior surface of said ceramic cover, and a glass sealant layer disposed between said barrier layer and said interior surface of said ceramic cover, said barrier layer comprising a polyimide film, and said composite cover being capable of withstanding temperatures of up to about 450° C. without delmamination of said polyimide film from said glass sealant layer.

* * * * *